(12) United States Patent
Lee et al.

(10) Patent No.: US 8,071,988 B2
(45) Date of Patent: Dec. 6, 2011

(54) WHITE LIGHT EMITTING DEVICE COMPRISING A PLURALITY OF LIGHT EMITTING DIODES WITH DIFFERENT PEAK EMISSION WAVELENGTHS AND A WAVELENGTH CONVERTER

(75) Inventors: Chung-Hoon Lee, Seoul (KR); Gundula Roth, Levenhagen (GR); Walter Tews, Greifswald (GR)

(73) Assignee: Seoul Semiconductor Co., Ltd., Seoul (KR)

( * ) Notice: Subject to any disclaimer, the term of this patent is extended or adjusted under 35 U.S.C. 154(b) by 611 days.

(21) Appl. No.: 11/568,769

(22) PCT Filed: May 3, 2005

(86) PCT No.: PCT/KR2005/001287
§ 371 (c)(1),
(2), (4) Date: Sep. 18, 2007

(87) PCT Pub. No.: WO2005/109532
PCT Pub. Date: Nov. 17, 2005

(65) Prior Publication Data
US 2009/0262515 A1    Oct. 22, 2009

(30) Foreign Application Priority Data
May 6, 2004    (KR) .................. 10-2004-0032017

(51) Int. Cl.
*H01L 29/18*    (2006.01)
(52) U.S. Cl. ............... 257/88; 257/89; 438/46; 362/231
(58) Field of Classification Search .................. None
See application file for complete search history.

(56) References Cited

U.S. PATENT DOCUMENTS

| | | | |
|---|---|---|---|
| 2,110,162 A | 3/1938 | Leverenz | |
| 2,402,760 A | 6/1946 | Leverenz | |
| 2,570,136 A | 10/1951 | Lyon | |
| 2,617,773 A | 11/1952 | Nagy et al. | |

(Continued)

FOREIGN PATENT DOCUMENTS

AT    410266    3/2003

(Continued)

OTHER PUBLICATIONS

Bogner et al., DE 102 33 050 A1, Feb. 05, 2004, Machine Translation.*

(Continued)

*Primary Examiner* — Marcos D Pizarro
*Assistant Examiner* — Andres Munoz
(74) *Attorney, Agent, or Firm* — H.C. Park & Associates, PLC

(57) ABSTRACT

Disclosed herein is a light emitting device including one or more light emitting diodes to primarily emit light having different wavelengths in the wavelength range of ultraviolet rays and/or blue light, and a wavelength-conversion means to convert the primary light into secondary light in the visible light wavelength range. The light emitting device of the current invention has a high color temperature of 2000 to 8000 K or 10000 K and a high color rendering index of 90 or more, thus easily realizing desired emission on the color coordinate system. Therefore, the lighting emitting device is applicable to mobile phones, notebook computers, and keypads or backlight units for various electronic products, and, in particular, automobiles and exterior and interior lighting fixtures.

18 Claims, 6 Drawing Sheets

U.S. PATENT DOCUMENTS

| | | |
|---|---|---|
| 2,719,128 A | 9/1955 | Kressin |
| 2,780,600 A | 2/1957 | Wollentin |
| 3,143,510 A | 8/1964 | Bakker |
| 3,598,752 A | 8/1971 | Sisneros et al. |
| 3,644,212 A | 2/1972 | McAllister et al. |
| 3,893,939 A | 7/1975 | DeKalb et al. |
| 3,905,911 A | 9/1975 | Kelsey et al. |
| 4,215,289 A | 7/1980 | De Hair et al. |
| 4,770,950 A | 9/1988 | Ohnishi |
| 4,972,086 A | 11/1990 | Bryan et al. |
| 5,032,316 A | 7/1991 | Takahashi et al. |
| 5,433,295 A | 7/1995 | Murphy |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |
| 5,965,192 A | 10/1999 | Potter |
| 5,998,925 A | 12/1999 | Shimizu et al. |
| 6,045,722 A | 4/2000 | Leblans et al. |
| 6,066,861 A | 5/2000 | Hohn et al. |
| 6,084,250 A * | 7/2000 | Justel et al. ............... 257/89 |
| 6,357,889 B1 * | 3/2002 | Duggal et al. ............... 362/84 |
| 6,373,184 B1 | 4/2002 | Suh et al. |
| 6,472,765 B1 | 10/2002 | Sano et al. |
| 6,482,664 B1 | 11/2002 | Lee et al. |
| 6,565,771 B1 | 5/2003 | Ono et al. |
| 6,670,751 B2 | 12/2003 | Song et al. |
| 6,686,691 B1 | 2/2004 | Mueller et al. |
| 6,842,664 B2 | 1/2005 | Harada et al. |
| 6,982,045 B2 | 1/2006 | Menkara et al. |
| 6,982,048 B1 | 1/2006 | Atwater et al. |
| 6,987,353 B2 | 1/2006 | Menkara et al. |
| 7,005,679 B2 * | 2/2006 | Tarsa et al. ............... 257/89 |
| 7,019,335 B2 | 3/2006 | Suenaga |
| 7,029,602 B2 | 4/2006 | Oshio |
| 7,045,078 B2 | 5/2006 | Choi |
| 7,138,770 B2 | 11/2006 | Uang et al. |
| 7,189,340 B2 | 3/2007 | Shimomura et al. |
| 7,206,507 B2 * | 4/2007 | Lee et al. ............... 396/182 |
| 7,229,571 B2 | 6/2007 | Ezuhara et al. |
| 7,244,965 B2 * | 7/2007 | Andrews et al. ............... 257/98 |
| 7,332,746 B1 * | 2/2008 | Takahashi et al. ............... 257/98 |
| 7,468,147 B2 | 12/2008 | Shida et al. |
| 7,554,129 B2 | 6/2009 | Roth et al. |
| 7,564,180 B2 * | 7/2009 | Brandes ............... 313/501 |
| 7,608,200 B2 | 10/2009 | Seto et al. |
| 7,679,101 B2 * | 3/2010 | Ota et al. ............... 257/100 |
| 7,679,281 B2 | 3/2010 | Kim et al. |
| 2002/0015013 A1 | 2/2002 | Ragle |
| 2003/0026096 A1 | 2/2003 | Ellens et al. |
| 2003/0030063 A1 | 2/2003 | Sosniak et al. |
| 2003/0038295 A1 | 2/2003 | Koda |
| 2003/0168636 A1 | 9/2003 | Dobson et al. |
| 2004/0051111 A1 | 3/2004 | Ota et al. |
| 2004/0104391 A1 | 6/2004 | Maeda et al. |
| 2004/0135504 A1 | 7/2004 | Tamaki et al. |
| 2004/0136891 A1 | 7/2004 | Kijima et al. |
| 2004/0206970 A1 | 10/2004 | Martin |
| 2004/0251809 A1 | 12/2004 | Shimomura |
| 2005/0001225 A1 | 1/2005 | Yoshimura et al. |
| 2005/0001537 A1 | 1/2005 | West et al. |
| 2005/0029927 A1 | 2/2005 | Setlur et al. |
| 2005/0117334 A1 | 6/2005 | Lee et al. |
| 2005/0139846 A1 | 6/2005 | Park et al. |
| 2005/0141048 A1 | 6/2005 | Mizutani |
| 2005/0239227 A1 | 10/2005 | Aanegola et al. |
| 2005/0264161 A1 | 12/2005 | Oaku et al. |
| 2005/0274930 A1 | 12/2005 | Roth et al. |
| 2005/0274972 A1 | 12/2005 | Roth et al. |
| 2006/0076883 A1 | 4/2006 | Himaki et al. |
| 2006/0158090 A1 | 7/2006 | Wang et al. |
| 2006/0261309 A1 | 11/2006 | Li et al. |
| 2006/0261350 A1 | 11/2006 | Kawazoe et al. |
| 2006/0267042 A1 | 11/2006 | Izuno et al. |
| 2007/0029526 A1 | 2/2007 | Cheng et al. |
| 2007/0247051 A1 | 10/2007 | Kuze et al. |
| 2007/0284563 A1 | 12/2007 | Lee et al. |
| 2008/0036364 A1 | 2/2008 | Li et al. |
| 2008/0067472 A1 | 3/2008 | Roth et al. |
| 2008/0067920 A1 | 3/2008 | Roth et al. |
| 2008/0224163 A1 | 9/2008 | Roth et al. |
| 2009/0050847 A1 | 2/2009 | Xu et al. |
| 2009/0050849 A1 | 2/2009 | Lee et al. |
| 2009/0134413 A1 | 5/2009 | Roth et al. |
| 2009/0152496 A1 | 6/2009 | Roth et al. |
| 2010/0002454 A1 | 1/2010 | Lee et al. |
| 2010/0165645 A1 | 7/2010 | Lee et al. |
| 2010/0207132 A1 | 8/2010 | Lee et al. |

FOREIGN PATENT DOCUMENTS

| | | |
|---|---|---|
| CN | 1218084 | 6/1999 |
| CN | 1289454 | 3/2001 |
| CN | 1317537 | 10/2001 |
| CN | 1344777 | 4/2002 |
| CN | 1434521 | 8/2003 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1249837 | 10/2002 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 5-78659 | 3/1993 |
| JP | 9-40946 | 2/1997 |
| JP | 9153644 | 6/1997 |
| JP | 2001-115157 | 4/2001 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97466 | 4/2002 |
| JP | 2002-173677 | 6/2002 |
| JP | 2002-335019 | 11/2002 |
| JP | 2002-359403 | 12/2002 |
| JP | 2002-368277 | 12/2002 |
| JP | 2002359403 | 12/2002 |
| JP | 200364358 | 3/2003 |
| JP | 2003-152229 | 5/2003 |
| JP | 2003-183649 | 7/2003 |
| JP | 2003224306 | 8/2003 |
| JP | 2003-321675 | 11/2003 |
| JP | 2004-006582 | 1/2004 |
| JP | 2004-10786 | 1/2004 |
| JP | 2004-505470 | 2/2004 |
| JP | 2004-71726 | 3/2004 |
| JP | 2004-71807 | 3/2004 |
| JP | 2004-134699 | 4/2004 |
| JP | 2004127988 | 4/2004 |
| JP | 2004-192833 | 7/2004 |
| JP | 2005-167177 | 6/2005 |
| JP | 2006-073656 | 3/2006 |
| JP | 2006-173433 | 6/2006 |
| JP | 2007-186674 | 7/2007 |
| JP | 2009-007545 | 1/2009 |
| KR | 10-232395 | 12/1999 |
| KR | 2001-32450 | 4/2001 |
| KR | 10-2001-0050839 | 6/2001 |
| KR | 2001-101910 | 11/2001 |

| | | |
|---|---|---|
| KR | 10-2002-0000835 | 1/2002 |
| KR | 10-2002-0053975 | 7/2002 |
| KR | 10-392363 | 7/2002 |
| KR | 10-2002-0079513 | 10/2002 |
| KR | 1020030063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0108816 | 11/2005 |
| KR | 10-2005-0117164 | 12/2005 |
| KR | 10-2005-0117165 | 12/2005 |
| KR | 10-2006-0034056 | 4/2006 |
| KR | 10-0626272 | 9/2006 |
| KR | 10-2006-0134728 | 12/2006 |
| KR | 10-2007-0016900 | 2/2007 |
| KR | 10-2007-0050833 | 5/2007 |
| KR | 10-2007-0064275 | 6/2007 |
| KR | 10-2007-0084659 | 8/2007 |
| KR | 10-2007-0086483 | 8/2007 |
| KR | 10-2007-0098194 | 10/2007 |
| KR | 10-2008-0046789 | 5/2008 |
| KR | 10-2008-0074241 | 7/2008 |
| KR | 10-2008-0075181 | 7/2008 |
| TW | 1328885 | 3/1999 |
| TW | 546854 | 8/2003 |
| WO | 1996-32457 | 10/1996 |
| WO | WO 9805078 | 2/1998 |
| WO | WO 9812757 | 3/1998 |
| WO | 98-39805 | 9/1998 |
| WO | 98-42798 | 10/1998 |
| WO | 00-19546 | 4/2000 |
| WO | 01-41215 | 6/2001 |
| WO | 2002-054502 | 7/2002 |
| WO | 2002-054503 | 7/2002 |
| WO | 02/089219 | 11/2002 |
| WO | 03-021691 | 3/2003 |
| WO | 2004-85570 | 10/2004 |
| WO | 2004/100275 | 11/2004 |
| WO | 2004-111156 | 12/2004 |
| WO | 2005068584 | 7/2005 |
| WO | 2005-109532 | 11/2005 |
| WO | 2005-112137 | 11/2005 |
| WO | 2006-043682 | 4/2006 |
| WO | 2006-06359 | 6/2006 |
| WO | 2006/081803 | 8/2006 |
| WO | 2006109659 | 10/2006 |
| WO | 2007-035026 | 3/2007 |
| WO | 2007-055538 | 5/2007 |
| WO | 2007-069869 | 6/2007 |
| WO | 2007-114614 | 11/2007 |
| WO | 2009-028818 | 3/2009 |

OTHER PUBLICATIONS

Non-final office action dated Nov. 2, 2009 issued in U.S. Appl. No. 12/098,263, filed Apr. 4, 2008.
Non-final office action dated Nov. 14, 2008 issued in U.S. Appl. No. 11/024,722, filed Dec. 30, 2004.
Non-final office action dated May 29, 2009 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated Nov. 29, 2006 issued in U.S. Appl. No. 11/024,722, filed Dec. 30, 2004.
Non-final office action dated Nov. 29, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Final office action dated Feb. 7, 2007 issued in U.S. Appl. No. 11/024,702, filed Dec. 30, 2004.
Notice of Allowance dated May 4, 2009 issued in U.S. Appl. No. 11/024,702.
Lee, Chung-Hoon, et al., U.S. Appl. No. 12/491,780.
Non-final office action dated Jan. 13, 2010 issued in U.S. Appl. No. 11/569,060, filed Jun. 22, 2007.
First Office Action of the State Intellectual Property Office of the PRC corresponding to Chinese Patent Application No. 2005800150173 dated Dec. 28, 2007 (corresponds to U.S. Appl. No. 11/569,060).
First Office Action of the State Intellectual Property Office of the PRC corresponding to Chinese Patent Application No. 200510002304.2 dated Feb. 15, 2008 (corresponds to U.S. Appl. No. 11/024,722).
Non-final office action dated Aug. 12, 2009 issued in U.S. Appl. No.11/569,060, filed Jun. 22, 2007.
Non-final office action dated Nov. 17, 2009 issued in U.S. Appl. No. 12/097,741, filed Oct. 9, 2008.
Office Action dated Dec. 28, 2007 corresponding to China Application No. 200580016844.4.
International Search Report dated Feb. 11, 2009 for PCT Application No. PCT/2008/004733.
Butler, "Fluorescent Lamp Phosphors", The Pennsylvania State University Press, 1980, pp. 281-284.
Wanmaker, "Luminescence of Copper-Activated Orthophosphates of the Type ABPO (A=Ca,Sr or Ba and B=Li,Na or K)", Journal of the Electrochemical Society, pp. 109-113.
Shionoya, "Phosphor Handbook", edited under the auspiece of Phosphor Research Society, CRC Press, 1999, pp. 238-239, 241.
Van Gool, Philips Res. Rept. Suppl., 3, 1, 1961(pp. 1-9, 30-51, 84-85).
Wanmaker, "Luminescence of Copper-Activated Calcium and Strontium Orthophosphates", Journal of the Electrochemical Society, pp. 1027-1031.
Shionoya, "Phosphor Handbook", edited under the auspiece of Phosphor Research Society, CRC Press, 1999, pp. 204-205.
Blasse, "Radiationless Processes in Luminescent Materials", Radiationless Processes, 1980, pp. 287-289, 293.
Butler, "Fluorescent Lamp Phosphors", The Pennsylvania State University Press, 1980, pp. 181-182.
Butler, "Fluorescent Lamp Phosphors", The Pennsylvania State University Press, 1980, pp. 175-176.
Bernhardt, Investigations of the Orange Luminescence of $PbMoO_4$ Crystals, Phys. Stat.Sol.(a),91,643,1985, pp. 643-647.
Shionoya, S., et al.(Eds.), "Principal phosphor materials and their optical properties" in Phosphor Handbook, CRC Press, 1999, p. 826.
Ralchenko, Yu., Kramida, A.E., Reader, J. and NIST ASD Team (2008). NIST Atomic Spectra Database (version 3.1.5), [Online]. Available: http://physics.nist.gov/asd3 [2009, Feb. 27]. National Institute of Standards and Technology, Gaithersburg, Md.
Yang, "Conversion Fluorescence in $Er^{3+}Yb^{3+}$-Co-Doped Oxy-Fluoride Compound Materials Based on $GeO_2$," Natural Science Journal of Xiangtan University, vol. 23, No. 2, 2001, pp. 37-41.
International Search Report dated Feb. 27, 2009 for PCT Application No. PCT/KR2008/004734.
X.W.Sun, et al. "Pulsed Laser Deposition of Silicate Phosphor Thin Films", Appl. Phys. A, 69, 1999, 5 pages.
W.L. Wanmaker, et al. "Luminescence of Phosphors Based on the Host Lattice $ABGe_2O_6$(A,B=Ca,Sr,Ba)" Journal of Solid State Chemistry 3, (1971), pp. 194-196.
N. S. Akhmetov, "Inorganic Chemistry", Moscow "Vysshaya Shkola", 1975.
Markovsky L, Ya. et al., Phosphors (Moscow-Leningrad, Khimiya Publishers, 1966, p. 7.
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting $Ba_3SiO_5:EU^{2+}$ Phosphor", Journal of Materials Science 40 (2005), pp. 2069-2071, XP-002511068.
H.G. Kang, et al., Embodiment and Luminescence Properties of $Sr_3SiO_5:Eu$(yellow-orange phosphor) by co-doping lanthanide, Solid State Phenomena, vol. 124-126 (2007) pp. 511-514.
G. Roth, et al. "Advanced Silicate Phosphors for improved white LED", Global Phosphor Summit Seoul/Korea, Mar. 5-7, 2007.

T.L. Barry, "Equilibria and Eu2+ luminescence of subsolidus phases bounded by Ba3MgSi2O8, Sr3MgSi2O8 and Ca3MgSi2O8," J. Electrochem. Soc., vol. 115 No. 7 (Jul. 1968), pp. 733-738.
G. Blasse, et al., "Fluorescence of Europium2+-activated silicates," Philips Res. Repts 23 (1968), pp. 189-199.
S. D. Jee, et al. "Photoluminescence properties of Eu2+ -activated Sr3SiO5 Phosphors," J. Mater Sci. 41 (2006), pp. 3139-3141.
T.L. Barry, "Fluorescence of Eu2+ Activated Phases in Binary Alkaline Earth Orthosilicate Systems", J. Electrochem Soc., Nov. 1968, pp. 1181-1184.
Shenstone, A.G., "The Third Spectrum of Copper(Cu III)", Journal of Research of the National Bureau of Standards-A. Physics and Chemistry, vol. 79A, No. 3, May-Jun. 1975, pp. 497-521.
Lever, A.B.P., "Inorganic Electronic Spectroscopy", 2nd ed., Elsevier, 1984, pp. 355 and 557-559.
Dubicki, Lujcan et al., "The First d-d Fluorescence of a six-Coordinate Copper(II) Ion", J.Am.Chem.Soc., 1989, No. 111, pp. 3452-3454.
Scacco, A., et al., "Optical Spectra of Cu2+ Ions in LiF Crystals", Radiation Effects and Defects in Solids, vol. 134, 1995, pp. 333-336.
Shionoya, S., et al.(Eds.), "Principal phosphor materials and their optical properties" in Phosphor Handbook, CRC Press, 1999, pp. 231-255.
Yang, Ping et al., "Photoluminescence of Cu+ doped and Cu2+ doped ZnS nanocrystrallites", Journal of Physics and Chemistry of Solids, No. 63, 2002, pp. 639-643.
Suyver, J.F., et al.,"Luminescence of nanocrystalline ZnSe:Cu", Applied Physics Letters, vol. 79, No. 25, Dec. 17, 2001, pp. 4222-4224.
Bol, Ageeth A., et al., "Luminescence of nanocrystalline ZnS:Cu2+", Journal of Luminescence, No. 99, 2002, pp. 325-334.
Non-final office action mailed May 23 2007 for U.S. Appl. No. 11/024,722, filed Dec. 30, 2004, entitled "Luminescent Material".
Declaration under 37 CFR 1.132 by Ulrich Kynast, dated Aug. 24, 2007.
Final office action dated Oct. 22, 2007 issued in U.S. Appl. No. 11/024,722, filed Dec. 30, 2004, entitled "Luminescent Material".
"Phosphors for Mercury Lamps" https:/www.lamptech.co.uk/documents/M14%20Phosphors.htm 2003 (2 pages).
Search Report dated Apr. 11, 2006 for EP Application No. EP04106880.0.
International Search Report dated Aug. 12, 2005 for PCT Application No. PCT/KR20051001287.
International Search Report dated Aug. 12, 2005 for PCT Application No. PCT/KR20051001288.
International Search Report dated Oct. 13, 2005 for PCT Application No. PCT/KR2005/002333.
International Search Report dated Oct. 24, 2005 for PCT Application No. PCT/KR2005/002332.
International Search Report dated Feb. 20, 2007 for PCT Application No. PCT/KR2006/004716.
International Search Report dated Jul. 12, 2007 for PCT Application No. PCT/KR20071001587.
International Search Report dated Mar. 21, 2007 for PCT Application No. PCT/KR2006/005500.
Roth, Gundula, U.S. Appl. No.12/295,438; corresponds to WO 2007/114614 and KR10-2007-0098194.
Lee, Chung-Hoon, et al., U.S. Appl. No. 12/440,001; corresponds to WO2009-028818 and KR10-2007-0086483 and KR 10-2008-0075181.
Search Report dated Aug. 21, 2007 for EP Application No. EP04106882.6.
Search Report dated Nov. 5, 2008 for EP Application No. EP06812549.1.
Search Report dated Feb. 2, 2009 for EP Application No. EP08014684.
Chen, R., "Developments in Luminescence and Display Materials Over the Last 100 Years as reflected in Electrochemical Society Publications", Journal of Electrochemical Society, 149, pp. 69-78.
G. Blasse, B.C. Grabmeier, "Luminescent Materials", Springer, 1994, pp. 40-47.
G. Blasse and A. Bril, "Characteristic Luminescence", Philips Technical Review, 31 (1970) 304, pp. 306 & 310.
S. Shionoya, W.M. Yen, "Phosphor Handbook" CRC Press, 1999, Ch. 3.3, pp. 179-182.
G. Blasse, B.C. Grabmeier, "Luminescent Materials", Springer, 1994, p. 25.
J. Gacia Sole, L.E. Bausa, D. Jaque, "An Introduction to the Optical Spectroscopy of Inorganic Solids", Wiley, 2005, pp. 163-164.
P.A. Cox, "Transition Metal Oxides", Oxford University Press, 1995, p. 105.
G.L. Miessler, D.A. Tarr, "Inorganic Chemistry", 3rd ed., Pearson/Prentice Hall, pp. 117-118.
B. Cordero, et al. "Covalent Radii Revisited", Dalton Trans., (2008), pp. 2832-2838.
G. Blasse, B.C. Grabmeier, "Luminescent Materials", Springer, 1994, pp. 87-90.
Feldman, C., "Inorganic Luminescent Materials: 100 Years of Research and Application", Adv. Funct. Matter, 2003, pp. 511-516.
Blasse, G., "Characteristic Luminescence", Philips Technical Review, vol. 31 (1970), pp. 304-332.
Declaration Under Rule 37 CFR 1.132 of Ulrich Kynast dated Sep. 6, 2008.
Shionoya, "Phosphor Handbook", CRC Press, pp. 183-184.
Garcia Sole, et al., "An Introduction to the Optical Spectroscopy of Inorganic Solids", pp. 132-133.
R.J. Angel et al., "Structure and twinning of single-crystal MgSiO3 garnet synthesized at 17 GPa and 1800° C.", American Mineralogist, 74 (1989) pp. 509-512.
Final Office Action dated Dec. 7, 2010 in U.S. Appl. No. 11/948,845.
Non Final Office Action dated Dec. 29, 2010 in U.S. Appl. No. 12/731,811.
Final Office Action dated Dec. 23, 2010 in U.S. Appl. No. 11/569,060.
Final Office Action dated Dec. 8, 2010 in U.S. Appl. No. 11/948,813.
International Search Report for PCT/KR20101003302 issued on Jan. 3, 2011, corresponding to U.S. Appl. No. 12/767,253.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
Non Final Office Action dated Nov. 30, 2010 in U.S. Appl. No. 12/196,923.
Notice of Allowance dated Aug 18, 2010 in U.S. Appl. No. 12/098,263.
Final Office Action dated May 11, 2010 in U.S. Appl. No.12/098,263.
Non Final Office Action dated Mar. 17, 2010 in U.S. Appl. No. 11/024,722.
Non Final Office Action dated Aug. 17, 2010 in U.S. Appl. No. 11/948,845.
EP Search Report dated Sep. 1, 2010 in EP Appl No. 08015119 correpsonding to U.S. Appl. No. 12/440,001.
EP Search Report dated Oct 6, 2010 in EP Appl No. 07745750.5—corresponding to U.S. Appl. No. 12/295,438.
Non Final Office Action dated Jun. 16, 2010 in U.S. Appl. No. 12/097,741.
Final Office Action dated Nov 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.

EP Search Report for EP 05 74 0759 was issued on Jul. 26, 2011.
EP Search Report for EP 05 74 0758 was issued on Jul. 26, 2011.
International Search Report for PCT/KR2010/003285 issued on Jan. 24, 2011, corresponding to U.S. Appl. No. 12/773,514.
Non-Final Office Action of U.S. Appl. No. 13/004,554 issued on Mar. 15, 2011.
Notice of Allowance of U.S. Appl. No. 11/024,722 issued on Mar. 10, 2011.
Final Office Action of U.S. Appl. No. 12/196,923 issued on Mar. 4, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP12007 issued on Jan. 28, 2011, corresponding to U.S. Appl. No. 12/098,263.
Non-Final Office Action of U.S. Appl. No. 12/854,001 issued on Apr. 6, 2011.
Non-Final Office Action of U.S. Appl. No. 12/440,001 issued on Apr. 27, 2011.

* cited by examiner

WHITE LIGHT EMITTING DEVICE COMPRISING A PLURALITY OF LIGHT EMITTING DIODES WITH DIFFERENT PEAK EMISSION WAVELENGTHS AND A WAVELENGTH CONVERTER

TECHNICAL FIELD

The present invention relates, in general, to a light emitting device (LED), and more particularly, to an LED comprising at least one light emitting source and a wavelength-conversion means to convert a wavelength of light generated by the light emitting source into a wavelength exhibiting a predetermined color of light.

BACKGROUND ART

Generally, an LED is advantageous because it has low power consumption and a long lifetime, and also, it can be mounted in limited spaces and is highly resistant to vibration. Recently, single color LEDs, for example, red, blue or green LEDs, and as well, white LEDs have been disclosed. Of these LEDs, the white LED is expected to be increasingly used as it is applied to automotive products and lighting fixtures.

In the LED techniques, white color is mainly realized by the two following methods. In the first method, red, blue and green light emitting diodes are disposed to be adjacent to one another, and colors of light emitted by the light emitting diodes combine to realize white light. However, since the light emitting diodes have different thermal or temporal properties, the hue changes depending on usage conditions. In particular, non-uniform color, such as color irregularity, is exhibited.

As a second method, a phosphor is included in the light emitting diode, and thus, primary light emitted by the light emitting diode is partially combined with secondary light converted into a predetermined wavelength by the phosphor to realize a white color. This method, for example, adopts a blue light emitting diode having a peak emission wavelength between 450 and 490 nm and a YAG phosphor to absorb light emitted by the blue light emitting diode and convert it into almost yellow fluorescent rays, and is disclosed in WO 98/05078 and WO 98/12757.

However, the above second method is disadvantageous because it cannot provide high white emission properties due to the YAG phosphor. That is, the YAG phosphor exhibits high emission efficiency only in the wavelength range lower than a peak emission wavelength of 560 nm. Thus, when such a phosphor is mixed with a blue light emitting diode having a wavelength between 450 and 490 nm, a low color temperature of 6000 to 8000 K and a low color rendering index of 60 to 75 are manifested, thus exhibiting a cool blue-white color.

Therefore, limitations are imposed on applications of the conventional white LEDs to various products. In particular, such an LED cannot be used for lighting fixtures.

DISCLOSURE

Technical Problem

Accordingly, the present invention has been made keeping in mind the above problems occurring in the related art, and an object of the present invention is to provide an LED having a wavelength-conversion means, which is advantageous in that because it has a high color temperature of about 2000 to 8000 K or 10000 K and a high color rendering index of 90 or more, it can be applied to electronic products, such as home appliances, audio systems and communication products, and as well, various exterior and interior displays, in particular, automobiles and lighting fixtures.

Technical Solution

In order to achieve the above object, the present invention provides an LED, which comprises one or more light emitting diodes to primarily emit light having different wavelengths in a wavelength range of ultraviolet rays and/or blue light; and a wavelength-conversion means to convert the primary light into secondary light in a visible light wavelength range.

In a preferred embodiment, the one or more light emitting diodes include a first light emitting diode having a peak emission wavelength between 360 and 420 nm; a second light emitting diode having a peak emission wavelength between 400 and 450 nm; and a third light emitting diode having a peak emission wavelength between 430 and 500 nm.

In another preferred embodiment, the one or more light emitting diodes include a first light emitting diode having a peak emission wavelength between 390 and 450 nm; and a second light emitting diode having a peak emission wavelength between 440 and 500 nm, and the wavelength-conversion means to convert primary light into secondary light in the visible light wavelength range includes a phosphor.

Further, the light emitting diodes to emit primary light and the wavelength-conversion means are mounted in a single package. As such, the single package is formed into a chip package, which comprises a substrate, one or more light emitting diodes mounted on the substrate, and a wavelength-conversion means placed around the light emitting diodes, or is formed into a top package, which comprises a substrate having a reflector formed thereon, one or more light emitting diodes mounted on the substrate, and a wavelength-conversion means placed around the light emitting diodes.

Moreover, when the substrate of the chip package or top package is formed of metal, heat generated by the one or more light emitting diodes can be effectively emitted. In addition, a radiation sheet is also mounted on the substrate formed of metal, thus further increasing heat emission efficiency.

On the substrate of the chip package or top package, a molded part to enclose the light emitting diodes and the wavelength-conversion means is preferably further formed. In this case, the wavelength-conversion means is uniformly distributed in the molded part.

Further, the single package is formed into a lamp package, which comprises a pair of lead electrodes, one or more light emitting diodes mounted on one of the pair of lead electrodes, a wavelength-conversion means placed around the light emitting diodes, and a molded part to enclose the light emitting diodes and the wavelength-conversion means.

Furthermore, the single package is formed into a high output package, which comprises one or more light emitting diodes, a wavelength-conversion means placed around the light emitting diodes, and a heat sink to emit heat generated by the one or more light emitting diodes. As such, a radiation sheet to emit heat from the heat sink is additionally included to further increase heat emission efficiency.

Also, the light emitting diodes each include a substrate formed of silicon carbide or sapphire and a nitride epitaxial layer formed on the substrate.

The wavelength-conversion means includes one or more phosphors having different properties, and is placed on at least one of a side surface, an upper surface and a lower surface of the light emitting diode, or is used in a mixture with an adhesive or a molding material.

In a preferred embodiment, the wavelength-conversion means includes any one selected from among a first phosphor having a peak emission wavelength between 440 and 500 nm, a second phosphor having a peak emission wavelength between 500 and 590 nm, a third phosphor having a peak emission wavelength between 580 and 700 nm, and mixtures thereof.

In another preferred embodiment, the wavelength-conversion means includes any one selected from among a first phosphor having a peak emission wavelength between 440 and 500 nm, a second phosphor having a peak emission wavelength between 500 and 590 nm, a third phosphor having a peak emission wavelength between 580 and 700 nm, and mixtures thereof. Further, each phosphor comprises one or more phosphor components having different properties in the corresponding wavelength range.

DESCRIPTION OF DRAWINGS

The above and other objects, features and other advantages of the present invention will be more clearly understood from the following detailed description taken in conjunction with the accompanying drawings, in which.

BEST MODE

Hereinafter, a detailed description will be given of preferred embodiments of the present invention, with reference to the appended drawings.

Figure 1:
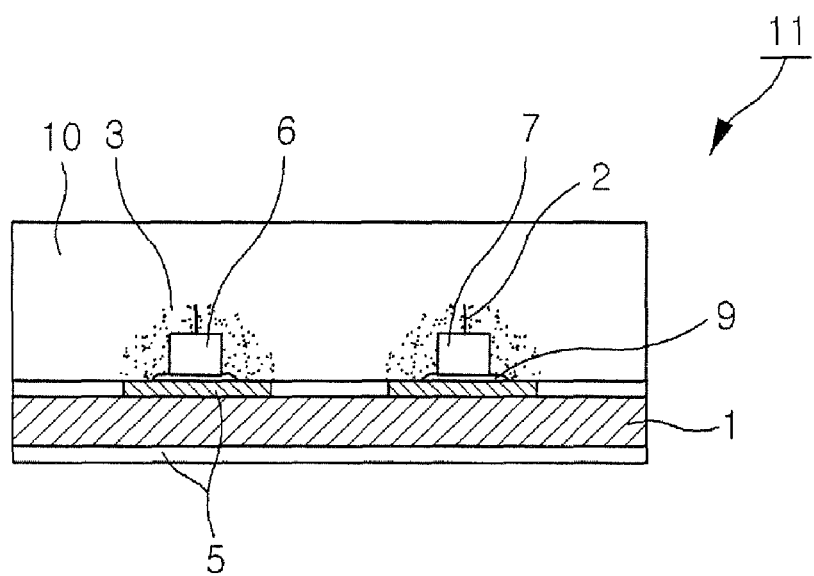
FIG. 1 is a longitudinal sectional view schematically showing an LED according to a first embodiment of the present invention, in which the LED is formed into a chip package comprising two light emitting diodes and a wavelength-conversion means.

FIG. 1 is a longitudinal sectional view schematically showing an LED according to a first embodiment of the present invention, in which a chip package including two light emitting diodes and a wavelength-conversion means is shown. As shown in the drawing, a substrate 1 has electrode patterns 5 formed on both surfaces thereof, and two light emitting diodes 6 and 7 to primarily generate blue light having different wavelengths are mounted on either electrode pattern 5. The light emitting diodes 6 and 7 are mounted on the electrode pattern 5 using a conductive adhesive 9, and electrodes of the light emitting diodes 6 and 7 are connected to another electrode pattern (not shown) by means of a conductive wire 2.

A wavelength-conversion means 3 is placed on upper surfaces and side surfaces of the two light emitting diodes 6 and 7. The wavelength-conversion means 3 functions to convert blue light generated by the light emitting diodes 6 and 7 into secondary light in the visible light wavelength range. The wavelength-conversion means 3 mixed with a resin, for example, an epoxy resin or a silicone resin may be dotted on the light emitting diodes 6 and 7. In addition, the wavelength-conversion means 3 mixed with the conductive adhesive 9 may be placed on the lower surfaces of the light emitting diodes 6 and 7.

An upper portion of the substrate 1 having the two light emitting diodes 6 and 7 mounted thereon is molded using the resin to form a molded part 10. In the LED 11 according to the first embodiment of the present invention, the wavelength-conversion means 3 is uniformly dotted on the upper surfaces and side surfaces of the light emitting diodes 6 and 7 at a predetermined thickness. Alternatively, the wavelength-conversion means 3 may be uniformly distributed throughout the molded part 10, which is disclosed in U.S. Pat. No. 6,482,664 filed by the present inventors.

Of the two blue light emitting diodes 6 and 7, a first light emitting diode 6 has a peak emission wavelength between 390 and 450 nm, and a second light emitting diode 7 has a peak emission wavelength between 440 and 500 nm. Each of the first and second light emitting diodes 6 and 7 includes a substrate made of silicon carbide or sapphire and a nitride epitaxial layer formed on the substrate.

The wavelength-conversion means 3 includes a single phosphor or a mixture of different phosphors. That is, the wavelength-conversion means 3 includes at least one phosphor selected from among a first phosphor having a peak emission wavelength between 440 and 500 nm, a second phosphor having a peak emission wavelength between 500 and 590 nm, and a third phosphor having a peak emission wavelength between 580 and 700 nm. In addition, each phosphor may consist of one or more phosphor components having different peak emission wavelengths in the corresponding wavelength range.

The phosphor of the wavelength-conversion means 3 is composed of orthosilicates represented by a general formula of $(Ba,Sr,Ca)_xSiO_4$:Eu and/or Mn. As such, the mixing ratio of Ba, Sr and Ca, the mixing ratio of $(Ba,Sr,Ca)_xSiO_4$:Eu and $(Ba,Sr,Ca)_xSiO_4$:Mn, and the mixing ratio of Ba, Sr, Ca, Mn and Eu are appropriately controlled to obtain the first phosphor having a peak emission wavelength between 440 and 500 nm, the second phosphor having a peak emission wavelength between 500 and 590 nm, and the third phosphor having a peak emission wavelength between 580 and 700 nm. In this way, the phosphors are mixed with each other at an appropriate ratio to constitute the wavelength-conversion means 3.

In the chip package 11 as the LED according to the first embodiment, the first light emitting diode 6 and the second light emitting diode 7 are supplied with external power by means of the electrode pattern 5. Thereby, blue light having a peak emission wavelength between 390 and 450 nm and blue light having a peak emission wavelength between 440 and 500 nm are primarily generated by the first light emitting diode 6 and the second light emitting diode 7, respectively. Subsequently, the primary blue light thus generated excites the phosphors, which then secondarily produce light having peak emission wavelengths between 440 and 500 nm, between 500 and 590 nm, and between 580 and 700 nm. Hence, the primary blue light generated by the first and second light emitting diodes 6 and 7 is combined with the secondary light converted into predetermined wavelengths by the phosphors to realize the color of the corresponding visible light wavelength range.

Further, the desired color is realized by appropriately controlling the mixing ratios of the phosphors. For example, in the case where the first phosphor having a peak emission wavelength between 440 and 500 nm and the second phosphor having a peak emission wavelength between 500 and 590 nm are used, the secondary light ranging from 580 to 700 nm is not generated. Hence, the primary blue light emitted by the first light emitting diode 6 and the second light emitting diode 7 is combined with the secondary light converted into predetermined wavelengths by the phosphors, thus realizing a predetermined color of the corresponding visible light wavelength range. In addition to the mixing ratios of the phosphors, the light emitting diodes having desired peak emission wavelengths in the corresponding wavelength ranges may be appropriately selected to achieve the desired emission on the color coordinate system.

Figure 2:
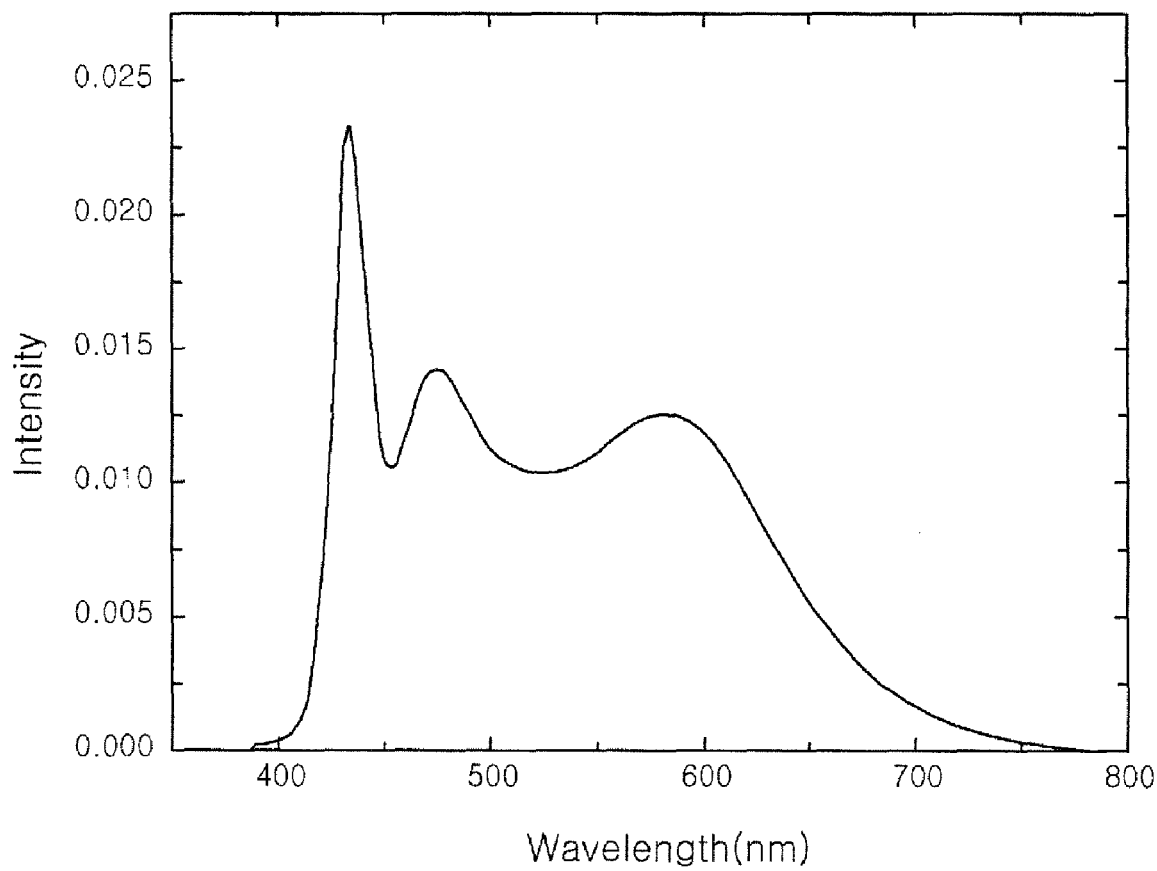
FIG. 2 is a graph showing the emission spectrum of the LED according to the first embodiment of the present invention, in which the LED is formed into the chip package comprising two blue light emitting diodes having different peak emission wavelengths and a wavelength-conversion means including a mixture of phosphors having peak emission wavelengths corresponding to green, yellow and orange light.

Therefore, when the two blue light emitting diodes 6 and 7 having different wavelengths are used and the phosphors having different peak emission wavelengths (blue, green or orange) are also mixed, the LED having the emission spectrum shown in FIG. 2 is manufactured. Such an LED has a color temperature of 3,500 to 7,500 K and a color rendering index of about 80-93. In the present embodiment, the light emitting diodes are appropriately selected and the mixing ratios of the phosphors are suitably controlled, so that the desired emission on the color coordinate system can be easily achieved. The LED according to the first embodiment is easily applicable to electronic products, such as home appliances, audio systems and communication products, and as well, various exterior and interior displays, in particular, automobiles and lighting fixtures.

Figure 3:
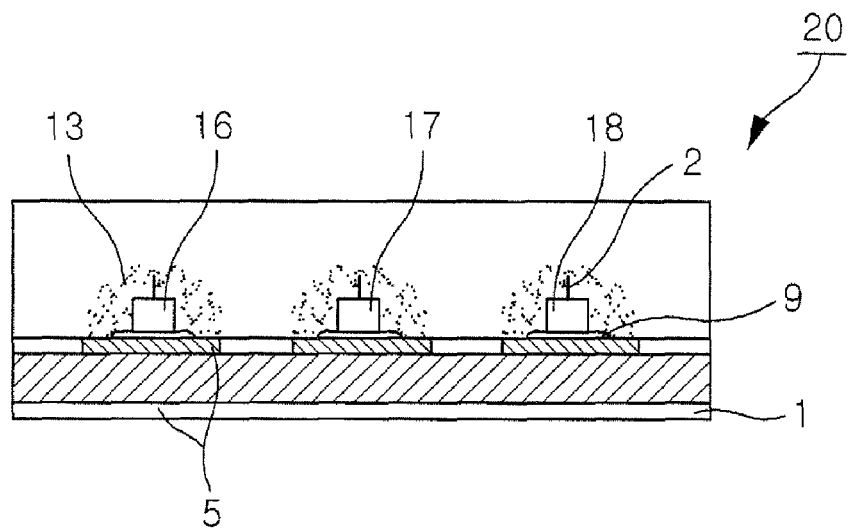
FIG. 3 is a longitudinal sectional view schematically showing an LED according to a second embodiment of the present invention, in which the LED is formed into a chip package comprising three light emitting diodes and a wavelength-conversion means.

FIG. 3 is a longitudinal sectional view schematically showing an LED according to a second embodiment of the present invention, in which a chip package including three light emitting diodes and a wavelength-conversion means is seen. The LED according to the second embodiment of the present invention has the same structure as in the first embodiment of FIGS. 1 and 2, with the exception that one light emitting diode is further included. However, light emitting diodes 16, 17 and 18 and phosphors constituting a wavelength-conversion means 13 of the LED according to the second embodiment have properties different from the first embodiment.

A first light emitting diode 16 has a peak emission wavelength between 360 and 420 nm, and a second light emitting diode 17 has a peak emission wavelength between 400 and 450 nm. In addition, a third light emitting diode 18 has a peak emission wavelength between 430 and 500 nm. Further, the wavelength-conversion means 13 includes a first phosphor having a peak emission wavelength between 440 and 500 nm, a second phosphor having a peak emission wavelength between 500 and 590 nm, and a third phosphor having a peak emission wavelength between 580 and 700 nm, which are mixed with each other at an appropriate ratio.

When the first, second and third light emitting diodes 16, 17 and 18 are supplied with external power by means of the electrode pattern 5, the first, second and third light emitting diodes 16, 17 and 18 primarily produce light at the corresponding peak emission wavelengths. Subsequently, the primary light is partially converted into secondary light having peak emission wavelengths between 420 and 490 nm, between 480 and 580 nm, and between 570 and 690 nm, by the excited phosphors. In this case, the primary light emitted by the light emitting diodes 16, 17 and 18 is combined with the secondary light converted into predetermined wavelengths by the phosphors to obtain light in the visible light wavelength range.

As such, each phosphor may consist of one or more phosphor components having different peak emission wavelengths in the corresponding wavelength range. In addition, the mixing ratios of the phosphors are appropriately controlled, and thus, the emission wavelength may be shifted into a desired emission wavelength on the color coordinate system.

Figure 4:
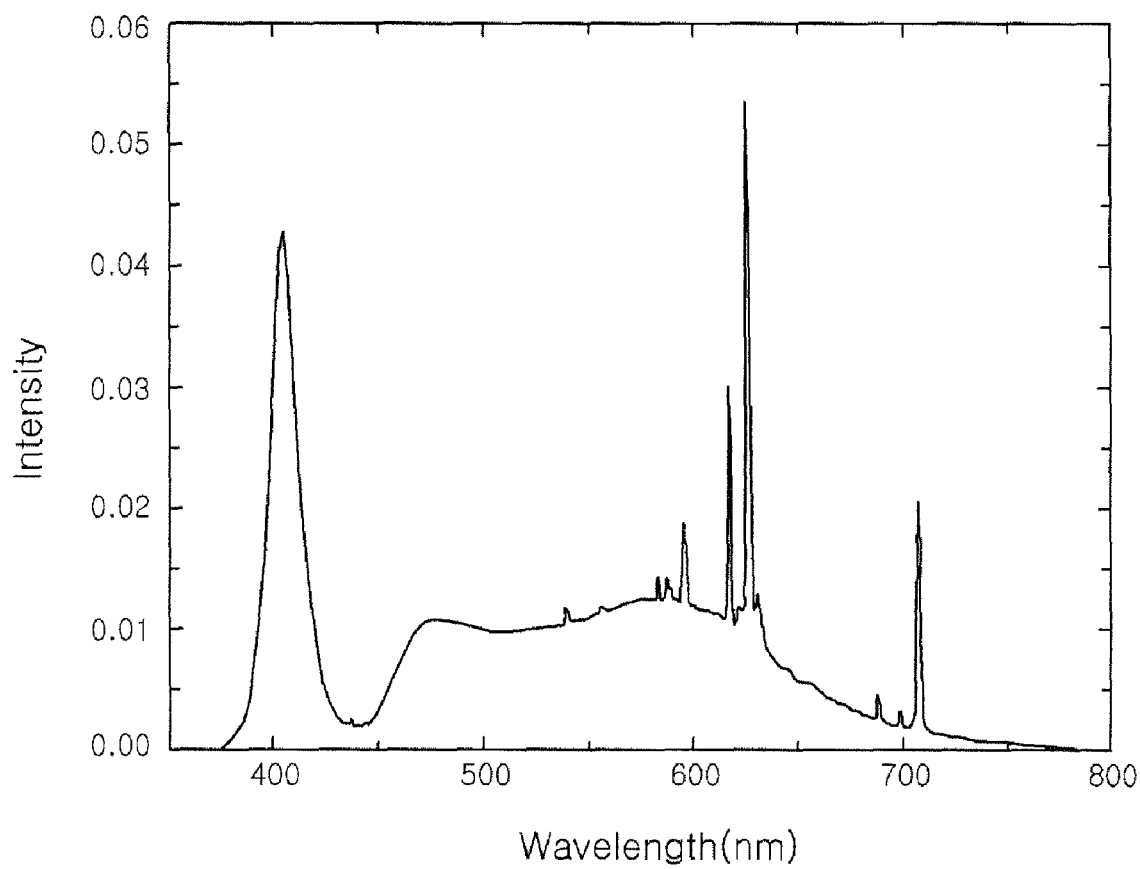
FIG. 4 is a graph showing the emission spectrum of the LED according to the second embodiment of the present invention, in which the LED is formed into the chip package comprising three blue light emitting diodes having different peak emission wavelengths and a wavelength-conversion means including a mixture of phosphors having peak emission wavelengths corresponding to green, orange and red light.

In the LED 20 according to the second embodiment, the same objects and effects as in the first embodiment of FIGS. 1 and 2 are achieved. FIG. 4 shows the emission spectrum of the chip package having three light emitting diodes 16, 17 and 18 having different peak emission wavelengths, and the wavelength-conversion means 13 including the phosphors having peak emission wavelengths corresponding to green, orange and red light. According to the second embodiment, a color temperature of about 2000 to 7000 K and a color rendering index of 70 to 90 are manifested.

Figure 5:
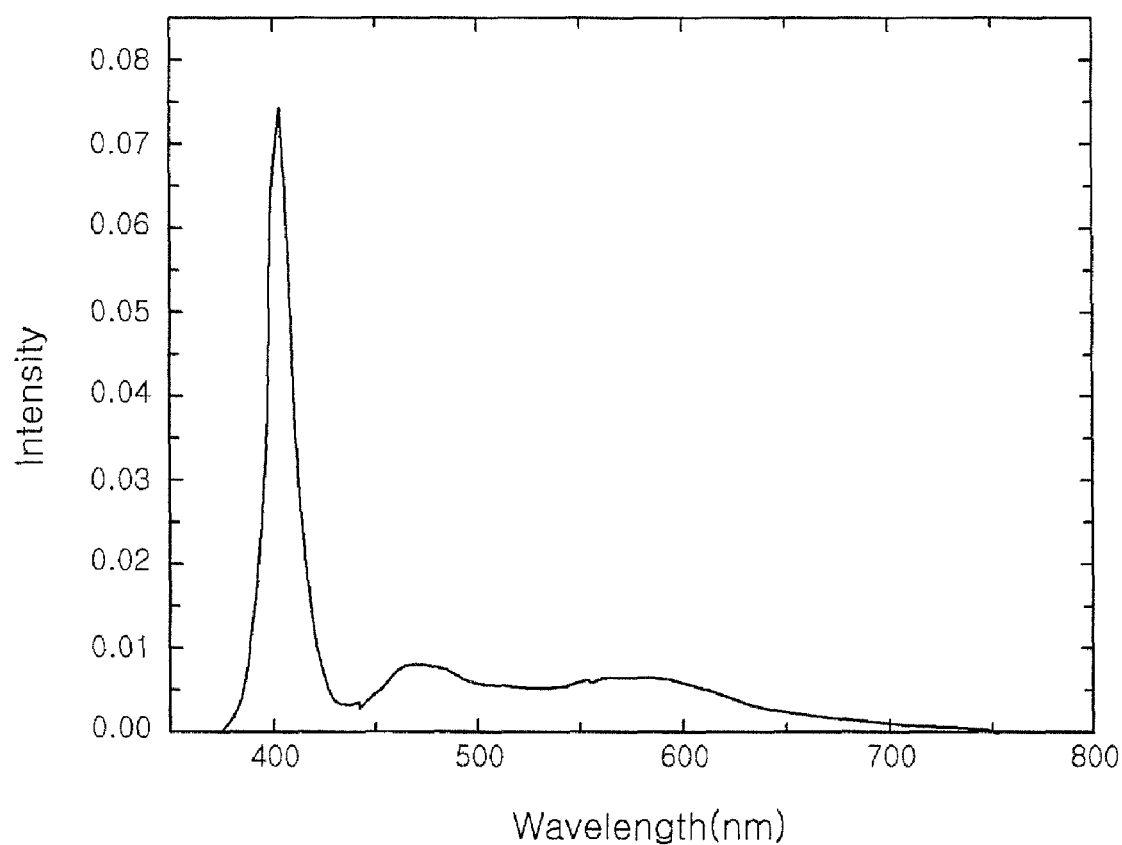
FIG. 5 is a graph showing the emission spectrum of the chip package comprising three blue light emitting diodes having different peak emission wavelengths and a wavelength-conversion means including a mixture of phosphors having peak emission wavelengths corresponding to green and orange light.

FIG. 5 shows the emission spectrum of the chip package including the three light emitting diodes 16, 17 and 18 having different peak emission wavelengths and the wavelength-conversion means 13 composed of the phosphors having peak emission wavelengths corresponding to green and orange light, according to the second embodiment. The chip package has a color temperature of about 6800 K and a color rendering index of 93.

The technical characteristics of the present invention, concerning FIGS. 1 to 5, are not limited only to the chip package, and may be applied to various LED packages, thus achieving the same objects and effects.

Hereinafter, the embodiments in which the present techniques are applied to various LED packages are described, with reference to the appended drawings, in which the same reference numerals are used throughout the different drawings to designate the same components and structures in FIGS. 1 to 5 and the technical principles relating to the light emitting diode and the wavelength-conversion means are similarly applied.

Figure 6:
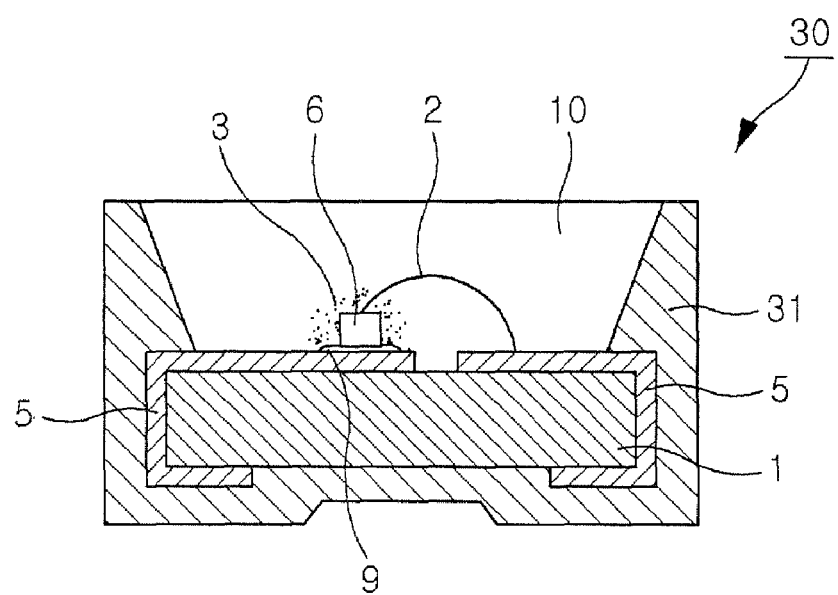
FIG. 6 is a longitudinal sectional view schematically showing a top package according to a third embodiment of the present invention.

FIG. 6 is a longitudinal sectional view of a top package, according to a third embodiment of the present invention. The top package 30, which is an LED for use in a backlight unit for displays, has almost the same structure as the LEDs according to the first and second embodiments, with the exception that a reflector 31 is mounted on the substrate. The reflector 31 functions to reflect light emitted by the light emitting diode 6 in a desired direction.

The top package 30 includes two light emitting diodes 6 and 7 or three light emitting diodes 16, 17 and 18, each of which has different peak emission wavelengths. Further, the top package 30 may be provided with the wavelength-conversion means 3, including a plurality of phosphors having different emission wavelengths, which are mixed with each other at one of various ratios. Such a wavelength-conversion means 3 may be dotted on the light emitting diode 6 in the reflector 31 or uniformly distributed in the resin molded part 10.

Figure 7:
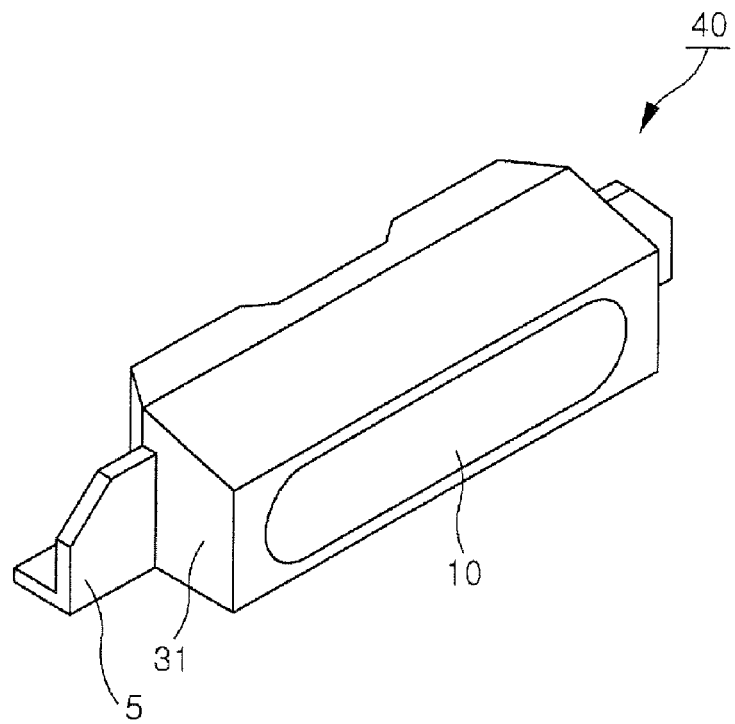
FIG. 7 is a perspective view showing a side package according to a fourth embodiment of the present invention.

FIG. 7 is a perspective view showing a side package according to a fourth embodiment of the present invention. The side package 40 has almost the same structure as the top package of FIG. 6, with the exception that its outer appearance is shaped in a very thin rectangle. A detailed description of the side package 40 according to the fourth embodiment refers to the description related to FIG. 6.

In the embodiments shown in FIGS. 1 to 7, the substrate 1 formed of metal having high heat conductivity is used to readily emit heat generated when operating the light emitting diodes 6 and 7 or 16, 17 and 18. Thereby, a high output LED can be obtained. Further, when a radiation sheet (not shown) is additionally attached on the substrate, heat may be effectively radiated from the light emitting diodes 6 and 7 or 16, 17 and 18.

Figure 8:
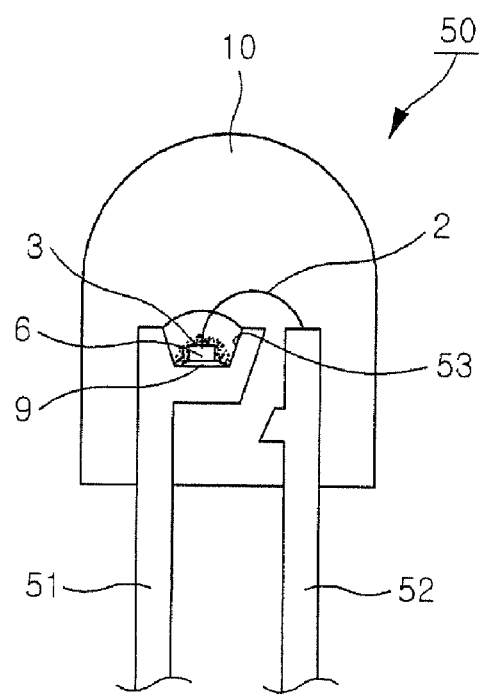
FIG. 8 is a longitudinal sectional view schematically showing a lamp package according to a fifth embodiment of the present invention.

FIG. 8 is a longitudinal sectional view showing a lamp package according to a fifth embodiment of the present invention. The lamp package 50 includes a pair of lead electrodes 51 and 52. A diode holder 53 is formed at an upper end of the lead electrode 51. The diode holder 53 is cup-shaped, in which two light emitting diodes 6 and 7 or three light emitting diodes 16, 17 and 18 are mounted. The light emitting diodes 6 and 7 or 16, 17 and 18 have different peak emission wavelengths, as in the above embodiments. The electrodes of the light emitting diodes 6 and 7 or 16, 17 and 18 are connected to the other lead electrode 52 by means of the conductive wire 2.

The inner wall of the cup-shaped holder 53 is coated with an epoxy resin 54 mixed with a predetermined amount of wavelength-conversion means 3 or 13. The wavelength-conversion means 3 includes a plurality of phosphors having different peak emission wavelengths, which are mixed with each other at an appropriate ratio, as in the above embodiments. Further, each phosphor may consist of one or more phosphor components having predetermined peak emission wavelengths in the corresponding wavelength range.

The outer portion of the holder 53 including the light emitting diodes 6 and 7 or 16, 17 and 18 and the wavelength-conversion means 3 or 13 is molded with the resin, for example, epoxy or silicone.

Figure 9:
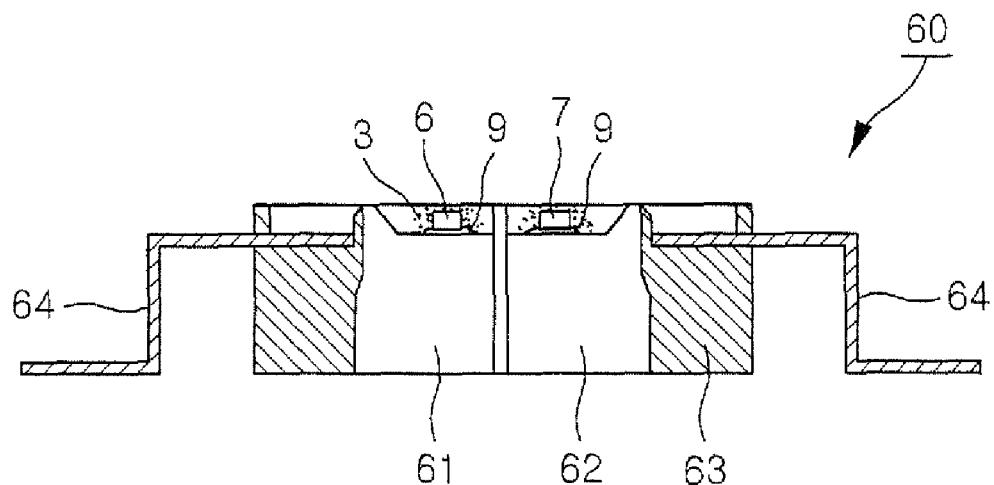
FIG. 9 is a longitudinal sectional view schematically showing a high output package according to a sixth embodiment of the present invention.

FIG. 9 is a longitudinal sectional view schematically showing a high output package according to a sixth embodiment of the present invention. The high output package 60 includes a plurality of separate heat sinks 61 and 62 on which the light emitting diodes 6 and 7 or 16, 17 and 18 are mounted, and a housing 63 wherein the wavelength-conversion means 3 is placed on the upper surfaces and side surfaces of the light emitting diodes 6 and 7. A plurality of lead frames 64 to which external power is supplied protrude externally from the housing 63.

Figure 10:
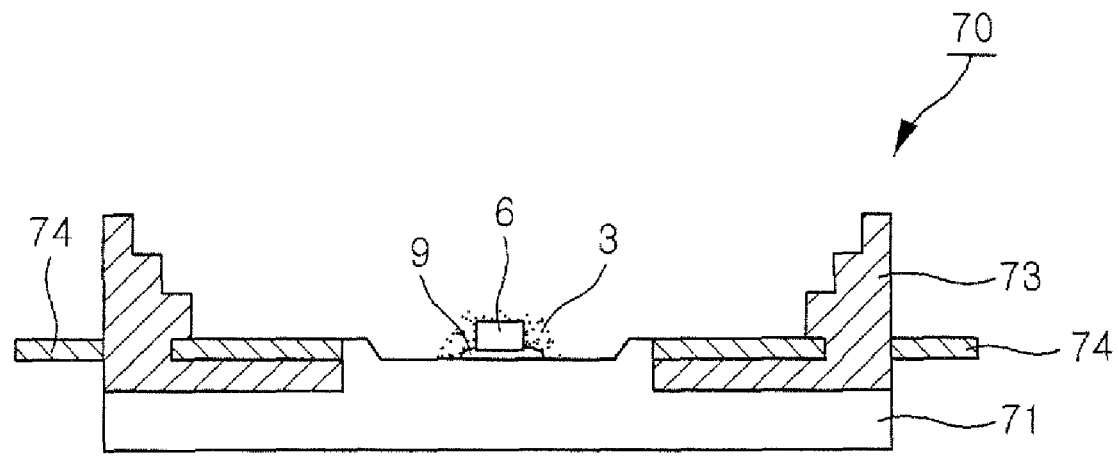
FIG. 10 is a longitudinal sectional view schematically showing a high output package according to a seventh embodiment of the present invention.
Figure 11:
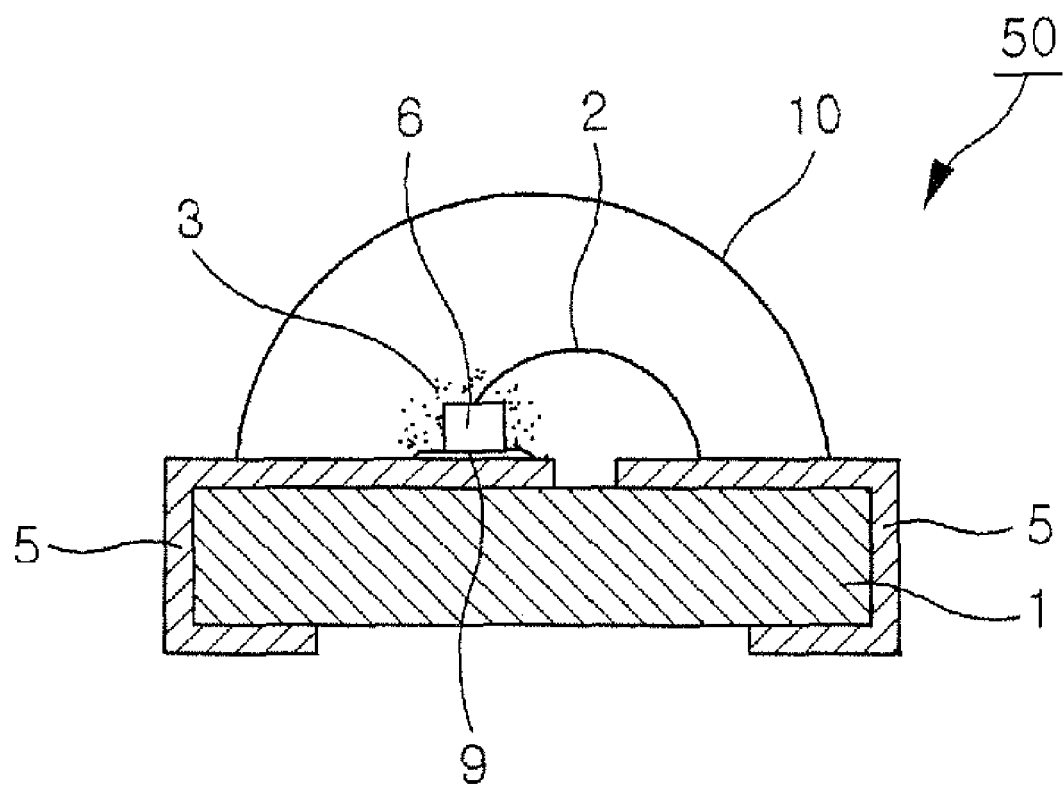

FIG. 10 is a longitudinal sectional view schematically showing a high output package according to a seventh embodiment of the present invention. In the package 70, a single heat sink 71 is partially received in a housing 73 to be exposed. Also, a pair of lead frames 74 protrudes externally.

The light emitting diodes 6 and 7 or 16, 17 and 18 are mounted on the heat sink 71 and connected to the lead frames 74 through the conductive wire (not shown). In addition, the wavelength-conversion means 3 or 13 is placed on the upper surface and side surfaces of the light emitting diode 6.

In the high output package 60 or 70 according to the sixth and seventh embodiments of the present invention, the wavelength-conversion means 3 is placed at an adhesion portion between the heat sinks 61 and 62 or 71 and the light emitting diodes 6 and 7 or 16, 17 and 18. A lens may be mounted on the housing 63 or 73. The package 70 according to the seventh embodiment is advantageous because its height can be minimized, compared to the package 60 according to the sixth embodiment.

In the case where the two light emitting diodes 6 and 7 are included in the high output package 60 or 70, the first light emitting diode having a peak emission wavelength between 390 and 450 nm and the second light emitting diode having a peak emission wavelength between 440 and 500 nm may be used. As such, the wavelength-conversion means includes a first phosphor having a peak emission wavelength between 440 and 500 nm, a second phosphor having a peak emission wavelength between 500 and 590 nm, and a third phosphor having a peak emission wavelength between 580 and 700 nm, which are mixed with each other at an appropriate ratio. In the case where the three light emitting diodes 16, 17 and 18 are included, the first light emitting diode has a peak emission wavelength between 360 and 420 nm, the second light emitting diode has a peak emission wavelength between 400 and 450 nm, and the third light emitting diode has a peak emission wavelength between 430 and 500 nm. As such, the wavelength-conversion means includes a first phosphor having a peak emission wavelength between 440 and 500 nm, a second phosphor having a peak emission wavelength between 500 and 590 nm, and a third phosphor having a peak emission wavelength between 580 and 700 nm, which are mixed with each other at an appropriate ratio.

In the high output package 60 or 70, it is preferable that the radiation sheet (not shown) be separately or integrally mounted on the heat sinks 61 and 62 or 71. Then, when each light emitting diode is operated by high input power, heat generated by each light emitting diode can be effectively emitted. The radiation sheet may be cooled by means of passive air circulation or forcible circulation using a fan.

In the high output package 60 or 70, when external power is supplied, each light emitting diode primarily emits light at the corresponding peak wavelengths. Then, while the phosphors are excited by primary light, they produce secondary light at the corresponding peak emission wavelengths. At this time, the primary light generated by each light emitting diode is combined with the secondary light converted into predetermined wavelengths by the phosphors to realize the color of the corresponding visible light wavelength range. Further, when the mixing ratios of the phosphors are appropriately controlled, the desired color on the color coordinate system can be easily realized.

Although the preferred embodiments of the present invention have been disclosed for illustrative purposes using two or three light emitting diodes, those skilled in the art will appreciate that various modifications, additions and substitutions are possible by using at least one light emitting diode, without departing from the scope and spirit of the invention as disclosed in the accompanying claims.

INDUSTRIAL APPLICABILITY

As described hereinbefore, the present invention provides an LED having a relatively high color temperature of 2,000 to 8,000 K or 10,000 K and a high color rendering index of 90 or more, by appropriately controlling the mixing ratios of the phosphors having different peak emission wavelengths or selectively using the light emitting diodes having different peak emission wavelengths.

Since the LED of the present invention having high color temperature and color rendering properties functions to easily realize the desired emission on the color coordinate system, it can be variously applied to mobile phones, notebook computers, and keypads or backlight units for various electronic products. In particular, the LED can be used for automobiles and exterior and interior lighting fixtures.

The invention claimed is:

1. A light emitting device, comprising:
   at least two light emitting diodes comprising a first light emitting diode and a second light emitting diode, the first light emitting diode to emit primary light having a first peak emission wavelength in a wavelength range of ultraviolet above 360 nm and below 380 nm, the second light emitting diode to emit primary light having a second peak emission wavelength in a wavelength range of blue light, and the first peak emission wavelength being different from the second peak emission wavelength; and
   a wavelength converter to convert the primary light of the first peak emission wavelength and the second peak emission wavelength into secondary light in a visible light wavelength range,
   wherein the light emitting device emits white light comprising the primary light of the second peak emission wavelength and the secondary light converted from the primary light of the first peak emission wavelength and the primary light of the second peak emission wavelength by the wavelength converter.

2. The device according to claim 1, wherein the at least two light emitting diodes and the wavelength converter are mounted in a single package.

3. The device according to claim 2, wherein the single package is formed into a chip package, which comprises a substrate, the at least two light emitting diodes mounted on the substrate, and the wavelength converter disposed on the at least two light emitting diodes.

4. The device according to claim 3, wherein the substrate comprises a metal.

5. The device according to claim 4, further comprising a radiation sheet mounted on the substrate, wherein the radiation sheet comprises a metal.

6. The device according to claim 3, further comprising a molded part to enclose the at least two light emitting diodes and the wavelength converter on the substrate.

7. The device according to claim 6, wherein the wavelength converter is uniformly distributed in the molded part.

8. The device according to claim 2, wherein the single package is formed into a top package, which comprises a substrate having a reflector formed thereon, the at least two light emitting diodes mounted on the substrate, and the wavelength converter disposed on the at least two light emitting diodes.

9. The device according to claim 2, wherein the single package is formed into a lamp package, the lamp package comprising a pair of lead electrodes, the at least two light emitting diodes mounted on one of the pair of lead electrodes, the wavelength converter disposed on the at least two light emitting diodes, and a molded part to enclose the at least two light emitting diodes and the wavelength converter.

10. The device according to claim 2, wherein the single package is formed into a high output package, the high output package comprising at least two light emitting diodes, the wavelength converter disposed on the at least two light emitting diodes, and a heat sink.

11. The device according to claim 10, further comprising a radiation sheet.

12. The device according to claim 1, wherein the wavelength converter comprises a plurality of phosphors having different properties.

13. The device according to claim 1, wherein the wavelength converter is disposed on at least one of a side surface, an upper surface, and a lower surface of at least one of the at least two light emitting diodes, or is used in a mixture with an adhesive or a molding material.

14. The device according to claim 1, wherein the wavelength converter comprises
   a first phosphor having a peak emission wavelength between 440 and 500 nm,
   a second phosphor having a peak emission wavelength between 500 and 590 nm, and
   a third phosphor having a peak emission wavelength between 590 and 700 nm.

15. The device according to claim 14, wherein at least one of the first phosphor, the second phosphor and the third phosphor comprises a plurality of phosphor components having different properties.

16. The device according to claim 1, wherein the at least two light emitting diodes each comprise a substrate comprising silicon carbide or sapphire and a nitride epitaxial layer formed on the substrate.

17. The device according to claim 1, wherein the wavelength converter comprises at least one of
   a first phosphor having a peak emission wavelength between 440 and 500 nm,
   a second phosphor having a peak emission wavelength between 601 and 700 nm,
   and mixtures thereof.

18. The device according to claim 1, wherein the light emitting device further comprises a third light emitting diode to emit primary light having a third peak emission wavelength between 430 and 500 nm, the third peak emission wavelength being different from the first emission wavelength and the second emission wavelength, and
   wherein the second light emitting diode comprises a peak emission wavelength between 400 and 450 nm.

* * * * *